(12) United States Patent
Park

(10) Patent No.: US 6,275,079 B1
(45) Date of Patent: Aug. 14, 2001

(54) ANALOG DELAY LOCKED LOOP CIRCUIT

(75) Inventor: Boo Young Park, Cheongju (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/414,720

(22) Filed: Oct. 12, 1999

(30) Foreign Application Priority Data

Feb. 25, 1999 (KR) .................................................. 99-6361

(51) Int. Cl.⁷ ...................................................... H03L 7/00
(52) U.S. Cl. ............................................ 327/143; 327/158
(58) Field of Search .................................... 327/158, 143, 327/157, 161, 148, 149

(56) References Cited

U.S. PATENT DOCUMENTS

| | | | |
|---|---|---|---|
| 5,216,302 | * | 6/1993 | Tanizawa ............................... 327/157 |
| 5,410,263 | * | 4/1995 | Waizman ............................... 327/141 |
| 5,744,991 | * | 4/1998 | Jefferson et al. ....................... 327/158 |

* cited by examiner

Primary Examiner—Toan Tran
Assistant Examiner—Cassandra Cox
(74) Attorney, Agent, or Firm—Fleshner & Kim, LLP

(57) ABSTRACT

An analog delay locked loop circuit includes: a phase detector detecting a phase difference between an external clock signal and an internal clock signal, a charge pump performing a pumping operation according to an output from the phase detector, a low pass filter filtering an output from the charge pump, and outputting a control voltage, a supply power selecting unit outputting a first supply power or a second supply power according to a supply power selecting signal, a voltage control delay unit receiving a supply power selected by the supply power selecting unit, and delaying the external clock signal for a predetermined time according to the control voltage from the low pass filter, and a driver amplifying an output from the voltage control delay unit, and generating the internal clock signal.

23 Claims, 4 Drawing Sheets

ANALOG DELAY LOCKED LOOP CIRCUIT

BACKGROUND OF THE INVENTION

1. Field of the Invention

The present invention relates to a clock signal generating circuit, and in particular to an analog delay locked loop (DLL) circuit employed for a microprocessor or a synchronous dynamic random access memory (DRAM).

2. Description of the Background Art

As semiconductor memory devices are developed, memory chips are operated in a higher speed. In general, a clock signal generating circuit delays an external clock signal for a predetermined time, and generates an internal clock signal used for the high-speed memory chip. However, there is a limitation to delay the external clock signal. Accordingly, in order to obtain the internal clock signal locked to the external clock signal, a phase locked loop (PLL) circuit or a delay locked loop (DLL) circuit is employed in a high-performance integrated circuit.

As illustrated in FIG. 1, an analog DLL circuit used as a conventional clock signal generating circuit includes a phase detector 100, a charge pump 101, a low pass filter 102, a voltage control delay unit 103 and a driver 104.

The phase detector 100 detects a phase difference between the external clock signal CLKX and the internal clock signal CLKI. The phase detector 100 is a phase detector of an edge triggered method, and may be embodied by an exclusive OR gate XOR, a JK flip-flop and the like. The charge pump 101 carries out a pumping operation according to phase difference signals UP, DN outputted from the phase detector 100. The low pass filter 102 filters an output from the charge pump 101, and outputs a control voltage CV.

The voltage control delay unit 103 includes a plurality of delay cells connected in series, delays the external clock signal CLKX according to the control voltage CV outputted from the low pass filter 102, and outputs a delayed clock signal CLKD. Here, the number of the delay cells may be varied.

Referring to FIG. 2, there is shown a preferable embodiment of the voltage control delay unit 103.

As depicted in FIG. 2, the voltage control delay unit 103 includes: first to third inverters 10~12 having PMOS transistors and NMOS transistors, and sequentially delaying the external clock signal CLKX; and PMOS transistors 13~16 and NMOS transistors 17~20 each respectively connected to sources of the PMOS and NMOS transistors of the first to third inverters 10~12, and forming a current mirror. The PMOS transistors 13~16 and the NMOS transistors 17~20 serve as is load transistors.

The operation of the conventional analog DLL circuit will now be described.

The phase detector 100 compares phases of the two clock signals CLKX, CLKI having an identical frequency. When the phase of the internal clock signal CLKI is faster than that of the external clock signal CLKX, the phase detector 100 outputs the phase difference signal UP. In the case that the phase of the internal clock signal CLKI is slower than that of the external clock signal CLKX, the phase detector 100 outputs the phase difference signal DN. The charge pump 101 carries out the pumping operation according to the phase difference signals UP, DN outputted from the phase detector 100. The low pass filter 102 filters an output from the charge pump 101, and outputs the control voltage CV to the voltage control delay unit 103.

Accordingly, a delay amount of the voltage control delay unit 103 is determined by the control voltage CV. That is, a turn-on degree of the NMOS transistors 17~20 is controlled by a level of the control voltage CV, and thus loads of the inverters 10~12 are varied by the PMOS transistors 13~16 and the NMOS transistors 17~20 composing the current mirror. As a result, delay amounts of the inverters 10~12 are determined by the varied loads thereof, thereby generating the delay clock signal CLKD.

The driver 104 amplifies the delay clock signal CLKD outputted from the voltage control delay unit 103, and generates the internal clock signal CLKI in order to drive a large load capacitance of an internal circuit (not shown). The internal clock signal CLKI is inputted again into the phase detector 100. Therefore, the conventional analog DLL circuit generates the internal clock signal CLKI locked to the external clock signal CLKX by repeatedly performing the above operation.

However, a jitter is inevitably generated in the clock signal generating circuit (DLL or PLL) generating the internal clock signal having an identical phase to the external clock signal. The high-speed operation of the circuit is limited by a jitter property. Here, an element that influences much on the jitter property is noise resulting from a power supply source. There is also a problem that a circuit operated in a wide frequency region has an inferior jitter property in a low frequency.

In addition, there is an idle state or a stand-by state for reducing a power consumption in the high integrated circuit. When the idle state is converted to an active mode, in order to rapidly recover the clock signal, the clock signal generating circuit (PLL or DLL) must be maintained in an operational state. As a result, a current consumption of the clock signal generating circuit is increased.

SUMMARY OF THE INVENTION

It is therefore an object of the present invention to provide an analog delay locked loop (DLL) circuit capable of improving a jitter property and reducing a current consumption by varying a supply power source according to an using purpose.

In order to achieve the above-described object of the present invention, there is provided an analog delay locked loop (DLL) circuit including: a phase detector detecting a phase difference between an external clock signal and an internal clock signal; a charge pump performing a pumping operation according to an output from the phase detector; a low pass filter filtering an output from the charge pump, and outputting a control voltage; a supply power selecting unit outputting a first supply power of a Vcc level or a second supply power of a Vpp level according to a supply power selecting signal; a voltage control delay unit receiving the supply power selected by the supply power selecting unit, and delaying the external clock signal for a predetermined time according to the control voltage from the low pass filter; and a driver amplifying an output from the voltage control delay unit, and generating the internal clock signal.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE INVENTION

Figure 1:
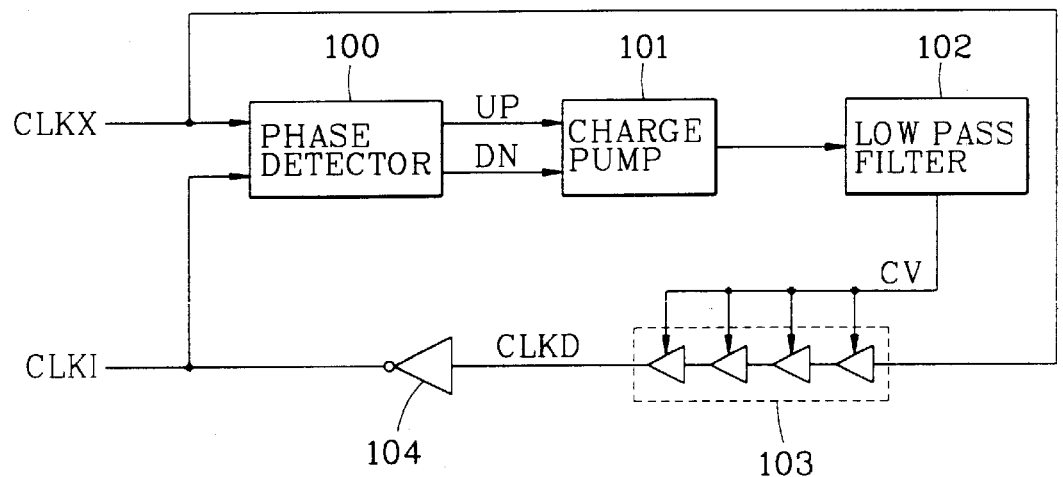
FIG. 1 is a schematic diagram illustrating a conventional analog delay locked loop circuit employed as a clock signal generating circuit.
Figure 2:
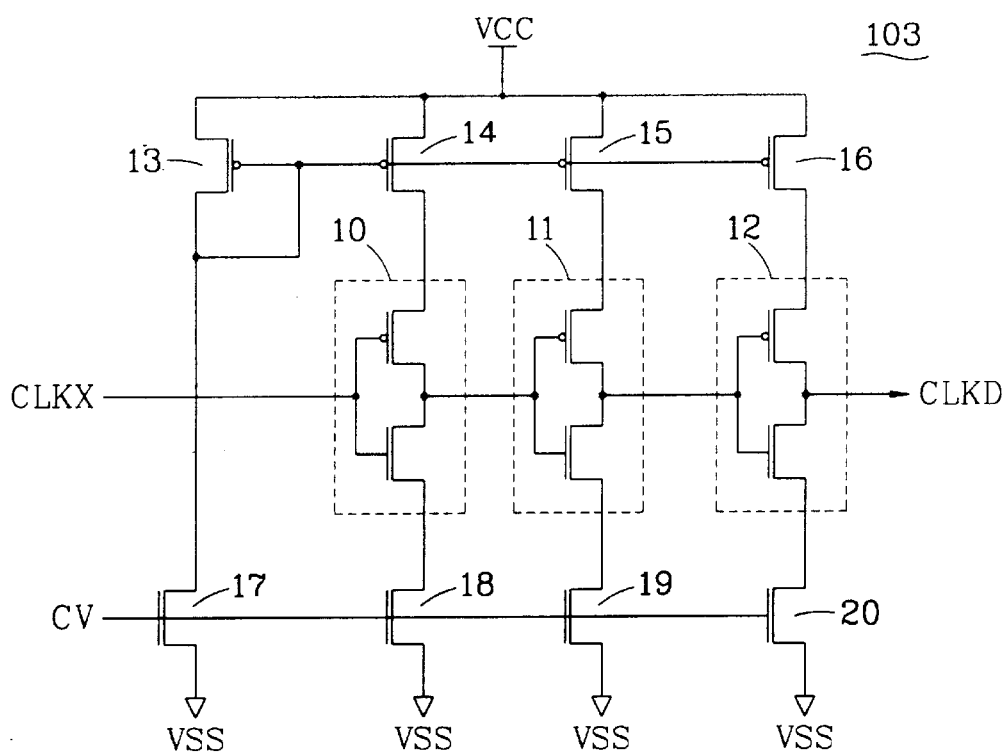
FIG. 2 is a detailed structure diagram illustrating a voltage control delay unit in the configuration of FIG. 1.
Figure 3:
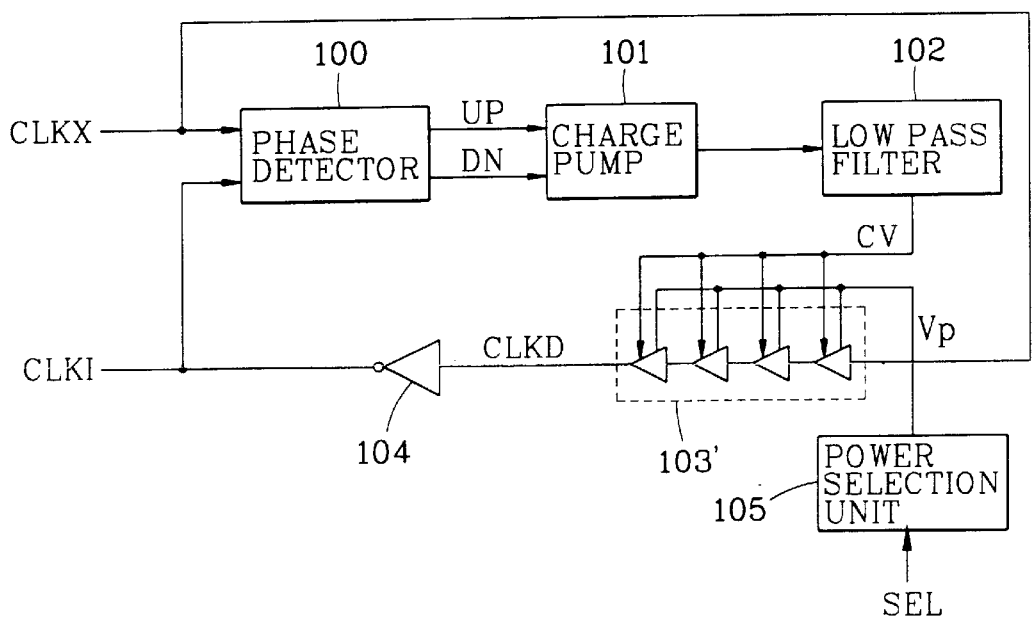
FIG. 3 is a schematic diagram illustrating an analog delay locked loop circuit according to the present invention.
Figure 4:
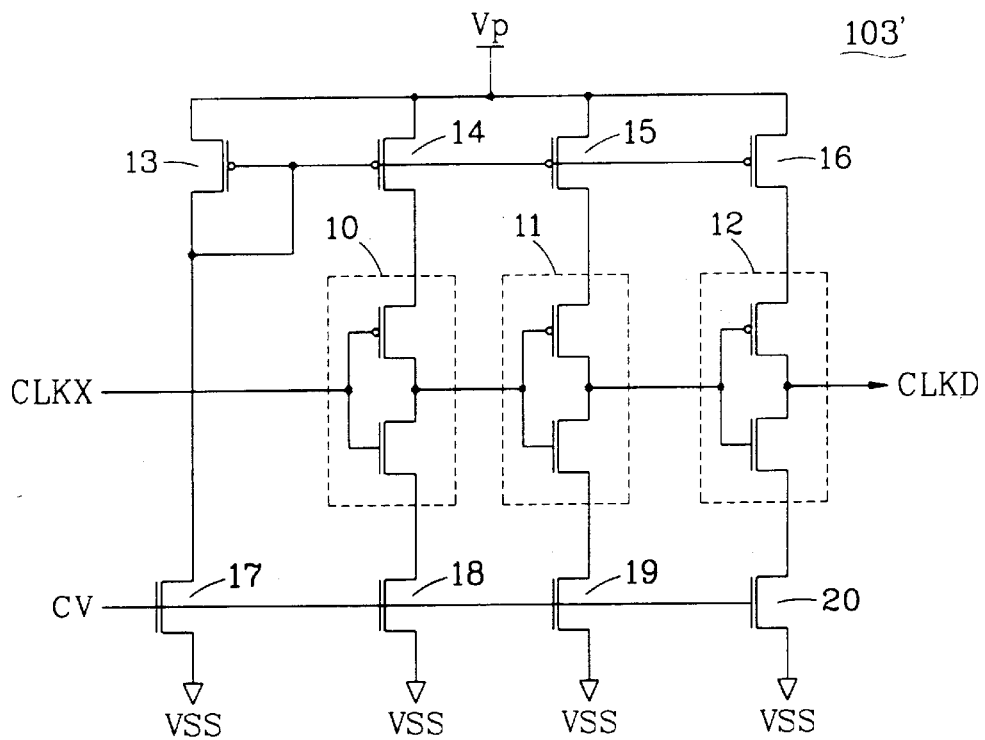
FIG. 4 is a detailed diagram illustrating a voltage control delay unit in the configuration of FIG. 3.

As shown in FIG. 3, an analog delay locked loop (DLL) circuit in accordance with the present invention further includes a supply power selecting unit 105, as compared with a conventional DLL circuit.

The supply power selecting unit 105 serves to provide a first supply power Vcc or a second supply power Vpp to a voltage control delay unit 103 according to an using purpose. The first supply power Vcc is identical to a supply power of an internal circuit (not shown), and in general, the second power Vpp is higher than the first supply power Vcc at least by a Vt value (Vt: threshold voltage). In addition, a voltage Vp selected by the supply power selecting unit 105 is merely used in the voltage control delay unit 103'.

Figure 5:
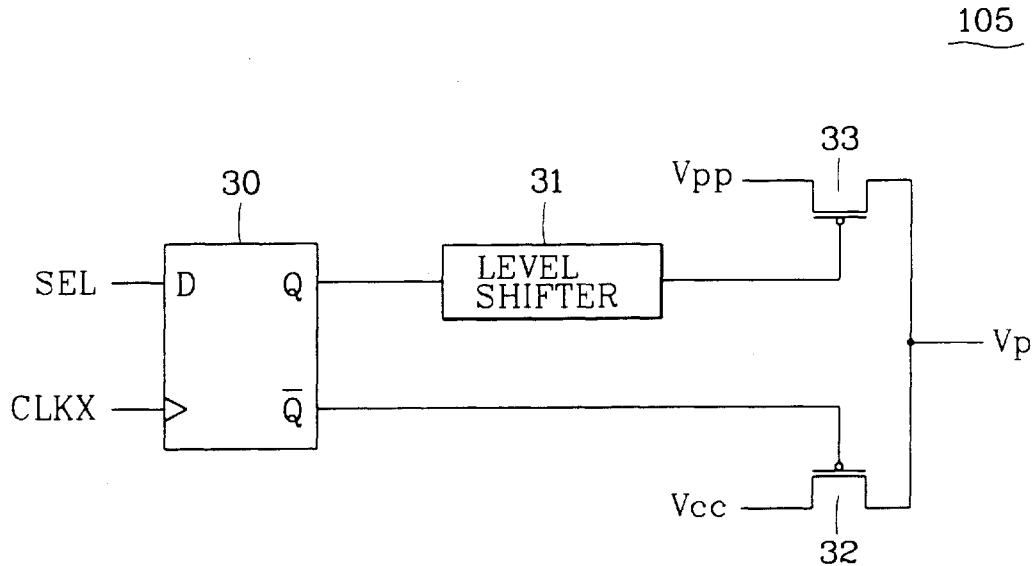
FIG. 5 is a detailed diagram illustrating a supply power selecting unit in the configuration of FIG. 3.

Referring to FIG. 5, there is shown a preferable embodiment of the supply power selecting unit 105.

As illustrated in FIG. 5, the supply power selecting unit 105 includes a D flip-flop 30 outputting a supply power selecting signal SEL according to an external clock signal CLKX, a level shifter 31 converting a level of a non-inverted output signal Q from the D flip-flop 30, a first switch 32 outputting the first supply power Vcc according to an output from the D flip-flop 30; and a second switch 33 outputting the second supply power Vpp according to an output from the level shifter 31. The level shifter 31 converts the Vcc level to the Vpp level.

The voltage control delay unit 103' is identical in constitution and operation to the conventional voltage control delay unit 103. The voltage control delay unit 103' consists of a plurality of delay cells that are connected in series. The respective delay cells delay the external clock signal CLKX according to a control voltage CV, and output a delayed clock signal CLKD. Here, the number of the delay cells may be varied. A sub-bias is identically provided to the PMOS transistors 13~16 forming a current mirror in accordance with the selected supply power Vp. The supply power Vp is only used in the voltage control delay unit 103', and thus wells of the PMOS transistors 13~16 are separated from those of the PMOS transistors in the other circuit.

The operation of the analog DLL circuit according to the present invention will now be described with reference to the accompanying drawings.

A process of synchronizing the internal clock signal CLKI to the external clock signal CLKX is identically carried out to a conventional one. A phase detector 100 compares the phase of the external clock signal CLKX with that of the internal clock signal CLKI, and outputs phase difference signals UP, DN. A charge pump 101 carries out a pumping operation according to the phase difference signals UP, DN, and outputs an output signal to a low pass filter 102. The low pass filter 102 filters the output signal from the charge pump 101, and outputs it to the voltage control delay unit 103'. The voltage control delay unit 103' delays the external clock signal CLKX according to a delay rate determined by the control voltage CV, and generates the delay clock signal CLKD. Accordingly, a driver 104 amplifies the delay clock signal CLKD, and outputs the internal clock signal CLKI. Thereafter, the analog DLL circuit according to the present invention generates the internal clock signal CLKI locked to the external clock signal CLKX by repeatedly performing the above-described operation.

The additional operation of the analog DLL circuit in accordance with the present invention, as compared with the conventional one, will now be described in more detail.

Firstly, the supply power selecting signal SEL is determined by the using purpose. In the case that a superior jitter property is required, the supply power selecting signal SEL is inputted at a low level. When a low current consumption is preferred, the supply power selecting signal SEL is inputted at a high level.

As illustrated in FIG. 5, when the superior jitter property is preferred, output signals $Q$,/Q from the D flip-flop 30 in the supply power selecting unit 105 respectively become a low level (Vss level) and a high level (Vcc level) by the low-level supply power selecting signal SEL. As a result, the first switch 32 is turned off, and the second switch 33 is turned on. Thus, the second supply power Vpp is inputted to the voltage control delay unit 103' through the turned-on second switch 33.

Figure 6:
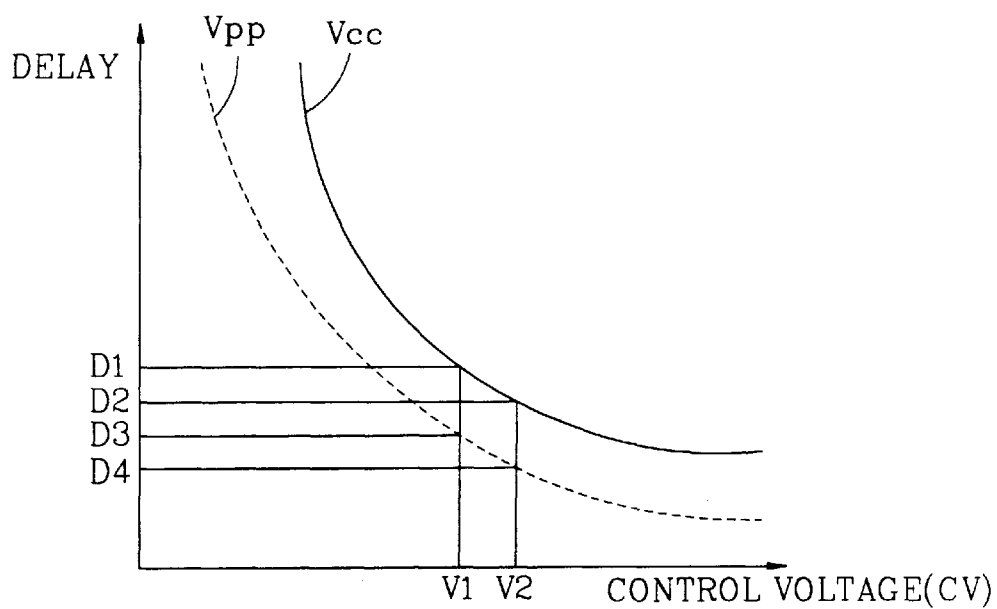
FIG. 6 is a graph showing a delay variation of each delay cell for a control voltage in the configuration of FIG. 3.

FIG. 6 illustrates an operational property curve of the voltage control delay unit 103' according to the first supply power Vcc or the second supply power Vpp. There are shown delay variations of each delay cell in regard to the control voltage CV. Here, the delay amount is in proportion to "$1/(CV-Vt)(Vt$: threshold voltage)", and a slope of the curve is in proportion to "$1/I_D (I_D$: current flowing in the current mirror)". Referring to FIG. 6, when the second supply power Vpp is inputted, the property curve is moved to a left direction, and ΔD becomes smaller in regard to ΔV (tD1–tD2>tD3–tD4). Accordingly, a variation of a delay time ΔtD in contrast with a unit variation ΔCV of the control voltage CV is smaller when the second supply power Vpp is provided than when the first supply power Vcc is provided. As a result, the jitter property is improved. In addition, a delay width which the voltage control delay unit 103' can obtain at a maximum voltage of the control voltage CV is smaller when the second supply power Vpp is provided than when the first supply power Vcc is provided. Accordingly, there is an advantage in that an operational frequency becomes much higher. That is, a capture range is widened.

Secondly, when the current consumption is prior to the jitter property in identical frequency operational conditions, namely when a low current consumption is preferred, the first supply power Vcc is provided to the voltage control delay unit 103'. That is, as illustrated in FIG. 5, the output signals Q,/Q of the D flip-flop 30 in the supply power selecting unit 105 become the high level (Vcc level) and the low level (Vss level), respectively, and the output signal Q is converted to the Vpp level in the level shifter 31. Consequently, the first switch 32 is turned on and the second switch 33 is turned off by the output from the level shifter 31 and the output signal/Q. Therefore, the first supply power Vcc is inputted to the voltage control delay unit 103' through the turned-on first switch 32. Accordingly, in the voltage control delay unit 103', an amount of the current that flows from the power supply voltage to the ground voltage is smaller when the first supply power Vcc is provided than when the second supply power Vpp is inputted.

As described above, the present invention selectively varies the supply power applied to the voltage control delay unit according to the using purpose, thereby improving the jitter property when using the supply power Vpp. In addition, in case the Vpp generating circuit is embodied as the clock generating circuit, it is less sensitive to a noise resulting from a switching of the supply power Vcc, thereby obtaining a better jitter property.

Besides, the present invention provides the supply power Vcc when the reduction of current consumption is preferred even though the jitter property becomes somewhat inferior. Further, in order to decrease the current consumption much more, a supply power lower than the supply power Vcc is provided. That is, the current is less consumed when the internal voltage generating circuit generating a lower voltage than the supply power Vcc, a 3×1 multiplexer can be used and the driver 104 is replaced by the level shifter.

Figure 7:
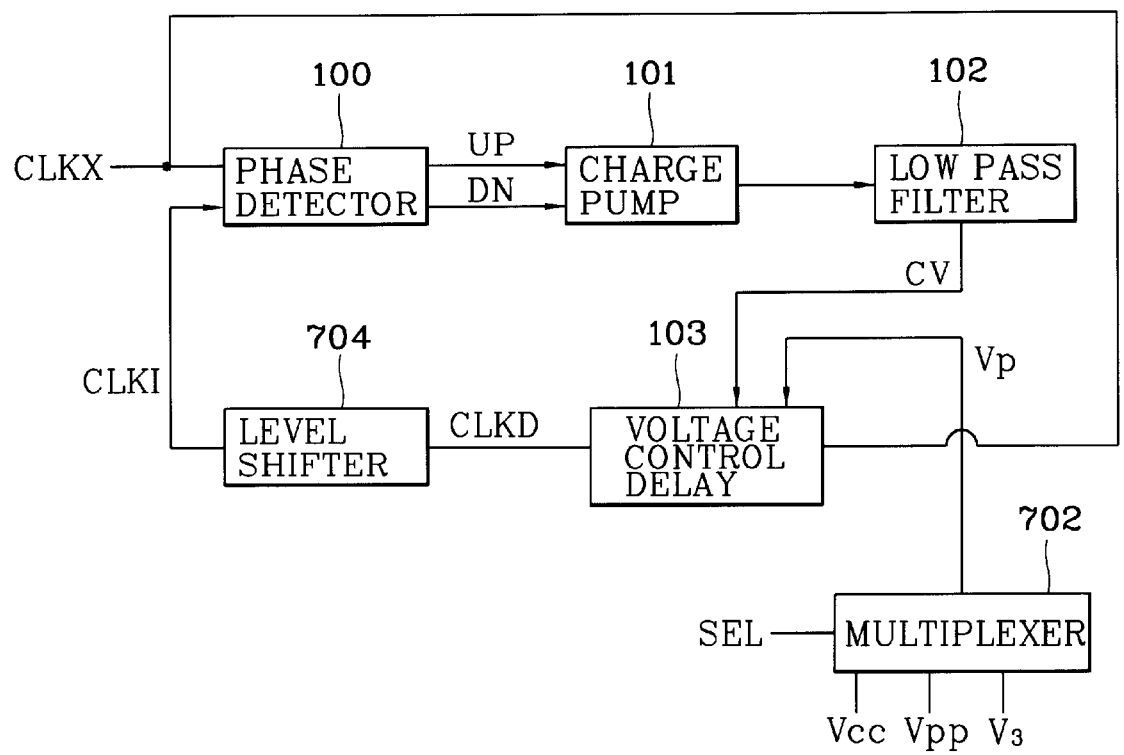
FIG. 7 is a detailed diagram illustrating another analog delay locked loop circuit according to the present invention.

That is, in another preferred embodiment shown in FIG. 7 based on an additional use where the current is less consumed, the internal voltage generating circuit generates an additional voltage $V_3$ lower than the supply power Vcc. As shown in FIG. 7, a 3×1 multiplexer 702 operates as the power selection unit 105 and the driver 104 is preferably replaced by a level shifter 704. In a similar manner to the level shifter 31, for example, the level shifter 704 can convert between power supply voltages (e.g., Vcc, Vpp and $V_3$). Thus, the level shifter 704 converts the delayed clock signal CLKD to the Vcc level as needed.

As discussed earlier, the analog DLL circuit of the present invention selectively provides the supply power to the voltage control delay unit according to the using purpose, and thus improves the jitter property when using the high supply power and reduces the current consumption when using the low supply power. Especially in the integrated circuit such as the synchronous DRAM, the low supply power is provided in the stand-by mode, and the high supply power is provided in the active mode. As a result, the power consumption is reduced in the stand-by mode, and the jitter is decreased in the active mode, thereby improving the performance of the integrated circuit.

In addition, many a delay cell is necessary for phase synchronization in a low frequency. However, when the low supply power is used, an identical effect is obtained merely with a relatively small number of the delay cells. Therefore, the present invention reduces an area overhead.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. An analog delay locked loop circuit comprising:
   a phase detector for detecting a phase difference between a first clock signal and a fed-back second clock signal;
   a charge pump for carrying out a pumping operation according to an output from the phase detector;
   a low pass filter for filtering an output from the charge pump, and for outputting a control voltage;
   a supply power selecting unit for outputting a first supply power or a second supply power in accordance with a supply power selecting signal;
   a voltage control delay unit for receiving a supply power selected in the supply power selecting unit, and for delaying the first clock signal in accordance with the control voltage from the low pass filter; and
   a driver for amplifying an output from the voltage control delay unit, and for generating the second clock signal.

2. The circuit according to claim 1, wherein the first clock signal is an external clock signal, and the second clock signal is an internal clock signal.

3. The circuit according to claim 1, wherein the first supply power is at a Vcc level, and the second supply power is at a Vpp level.

4. The circuit according to claim 3, wherein the Vpp level is greater than the Vcc level.

5. The circuit according to claim 1, wherein the supply power selecting unit provides the first supply power of the Vcc level to the voltage control delay unit when a chip is in a stand-by mode, and provides the second supply power of the Vpp level when the chip is in an active mode.

6. The circuit according to claim 1, wherein the power selecting signal is determined by an operational mode of the chip or an using purpose.

7. The circuit according to claim 1, wherein the power selecting unit comprises:
   a D flip-flop for outputting the power selecting signal according to the first clock signal;
   a level shifter for converting a level of a non-inverted output from the D flip-flop;
   a first switch for outputting the first supply power of the Vcc level according to an output from the D flip-flop; and
   a second switch for outputting the second supply power of the Vpp level according to an output from the level shifter.

8. The circuit according to claim 7, wherein the first and second switches are MOS transistors, and the first clock signal is an external clock signal.

9. The circuit according to claim 7, wherein the level shifter converts the Vcc level to the Vpp level.

10. The circuit according to claim 1, wherein the voltage control delay unit comprises:
    a plurality of inverters for sequentially delaying the first clock signal; and
    PMOS transistors and NMOS transistors each respectively connected to power supply terminals of the plurality of inverters and ground, and for composing a current mirror.

11. The circuit according to claim 10, wherein the first supply power of the Vcc level or the second supply power of the Vpp level is inputted to the power supply terminals, and wells of the PMOS transistors are separated from those in the other circuit.

12. An analog delay locked loop circuit comprises:
    a phase detector for detecting a phase difference between an external clock signal and an internal clock signal;
    a charge pump for carrying out a pumping operation according to an output from the phase detector;
    a low pass filter for filtering an output from the charge pump, and outputting a control voltage;
    a multiplexer for outputting one of first to third supply power in accordance with a supply power selecting signal; and
    a voltage control delay unit for receiving a supply power outputted from the multiplexer, and for delaying the external clock signal according to the control voltage from the low pass filter,
    wherein the internal clock signal is based on the delayed external clock signal from the voltage control delay unit.

13. The circuit according to claim 12, further comprising a level shifter for converting a level of an output from the voltage control delay unit, and for generating the internal clock signal.

14. The circuit according to claim 12, wherein the first supply power is at a Vcc level, the second supply power is at a Vpp level, and the third supply power is at a voltage level lower than Vcc.

15. The circuit according to claim 12, wherein the multiplexer outputs the second supply power of the Vpp level in order to improve a jitter property, and outputs the first or third supply power in order to reduce current consumption, the third supply power being at a lower level than the first supply power.

16. The circuit according to claim 12, wherein the voltage control delay unit comprises:

a plurality of inverters for sequentially delaying the first clock signal; and

PMOS transistors and NMOS transistors each respectively connected to power supply terminals of the plurality of inverters and ground, and for composing a current mirror.

17. The circuit according to claim 16, wherein one of the first to third supply power is inputted to the power supply terminals, and wells of the PMOS transistors are separated from those in the other circuit.

18. The circuit according to claim 17, wherein the first supply power is at a Vcc level, the second supply power is at a Vpp level, and the third supply power is at a lower level than Vcc.

19. An analog delay locked loop circuit comprising:

a phase detector that detects a phase difference between a first clock signal and a fed-back second clock signal;

a control unit that outputs a control voltage according to an output from the phase detector;

a supply power selector that selectively outputs a first supply power that determines a first delay range and a second supply power that determines a second delay range responsive to a supply power selecting signal;

a voltage control delay unit that receives a supply power selected in the supply power selecting unit and delays the first clock signal within a corresponding selected one of the first and second delay ranges in accordance with the control voltage from the low pass filter; and a driver that receives an output from the voltage control delay unit, and generates the second clock signal.

20. The circuit according to claim 19, wherein the power selecting signal is determined by an operational mode of the chip or an using purpose, and wherein Vpp level is one of greater than and less than a Vcc level.

21. The circuit according to claim 19, wherein the first supply power is at a Vcc level, and the second supply power is at a Vpp level.

22. The circuit according to claim 21, wherein the control unit comprises:

a charge pump that performs a pumping operation according to the output from the phase detector; and a filter that filters an output from the charge pump to output the control voltage, wherein the Vpp level is one of greater than and less than the Vcc level.

23. The circuit of claim 19, wherein each of the delay ranges is determined by an operational property curve of delay variations of a delay cell in the voltage control delay unit relative to the control voltage.

* * * * *